United States Patent
Nielsen et al.

(10) Patent No.: US 9,238,249 B2
(45) Date of Patent: Jan. 19, 2016

(54) ULTRASOUND TRANSMITTER

(75) Inventors: Max Earl Nielsen, Orting, WA (US);
Ricky Dale Jordanger, Allen, TX (US);
Ismail Hakki Oguzman, Plano, TX (US); Zheng Gao, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 525 days.

(21) Appl. No.: 13/590,672

(22) Filed: Aug. 21, 2012

(65) Prior Publication Data
US 2014/0055003 A1   Feb. 27, 2014

(51) Int. Cl.
*H03K 5/00* (2006.01)
*B06B 1/02* (2006.01)
*H01L 41/04* (2006.01)

(52) U.S. Cl.
CPC ........... *B06B 1/0215* (2013.01); *B06B 2201/55* (2013.01); *B06B 2201/76* (2013.01); *H01L 41/042* (2013.01)

(58) Field of Classification Search
USPC ........................................ 327/94–95
See application file for complete search history.

(56) References Cited

U.S. PATENT DOCUMENTS

| | | | |
|---|---|---|---|
| 4,438,354 A * | 3/1984 | Haque et al. | 327/337 |
| 5,659,254 A * | 8/1997 | Matsumoto et al. | 324/678 |
| 6,239,558 B1 * | 5/2001 | Fujimura et al. | 315/307 |
| 7,495,508 B2 * | 2/2009 | Tan | 327/554 |
| 7,863,934 B2 * | 1/2011 | Lin | 326/82 |

* cited by examiner

*Primary Examiner* — An Luu
(74) *Attorney, Agent, or Firm* — Alan A. R. Cooper; Frank D. Cimino

(57) ABSTRACT

A circuit for driving ultrasound transducers uses a sample-and-hold circuit to sample multiple sample periods of a transducer driving waveform, and uses the samples to modify drive parameters. Use of multiple sample periods enables independent measurement and adjustment of different portions of the transducer driving waveform to ensure mirror symmetry.

8 Claims, 5 Drawing Sheets

ULTRASOUND TRANSMITTER

BACKGROUND

In pulsed ultrasonography, short bursts of ultrasonic sound pressure waves are generated, and an image is formed from the reflected sound waves (echoes). The sound waves are typically produced by piezoelectric transducers. When a sound wave encounters a change in density, part of the sound wave is reflected back to the transducers. The time for an echo to return indicates the distance to the change in density, and the magnitude of the echo indicates the magnitude of the change in density. In conventional imaging, an image is formed from echoes having the same frequency as the transmitted frequency. In harmonic imaging, an image is formed from echoes having a frequency that is an integer multiple (harmonic) of the transmitted frequency. Typically, for harmonic imaging, only the second harmonic (the frequency that is twice the frequency of the fundamental frequency) has a sufficient intensity to provide useful imaging.

Harmonics may be generated as a result of a sound wave traveling through an elastic substance. As a sound wave travels through a substance, the peaks and troughs of the pressure wave cause the substance to alternately compress and expand. During compression, density increases, and the sound propagates slightly faster. During expansion, density decreases, and the sound propagates slightly slower. In addition, some substances are not linearly elastic. In particular, body tissues compress less than they expand. As a result of sound propagation speed and nonlinear elasticity, the sound waveform becomes progressively more distorted (asymmetrical) as it propagates, and the distortion produces harmonics of the fundamental frequency. In some situations, there are advantages to generating an image from harmonics instead of generating an image from the fundamental frequency. For one, a higher frequency provides improved spatial resolution to enable imaging of smaller objects. In addition, for body tissue, there are artifacts generated by reverberations of the body wall, and by weak echoes from the edge of the sound beam. Because harmonics are generated deeper in the tissue, they are not affected by the body wall. In addition, harmonic intensity is proportional to the square of the fundamental intensity, so weak fundamental echoes generate very weak harmonics that have less effect on the resulting images.

Harmonics of the transmitted frequency may also be generated by contrast agents that are injected into a region of interest. The contrast agents contain very small bubbles that vibrate at twice the frequency of the transmitted frequency. As a result, the strongest signal from the body at twice the frequency of the transmitted frequency comes from the region of tissue where the bubbles are located. In the resulting images, the region of tissue where the bubbles are located has a high contrast relative to other tissue.

Multiple techniques are used to eliminate the fundamental frequency in the echoes for harmonic imaging. One technique is to use a band-pass or high-pass filter on the signals from the echoes. Another technique is to add the echoes from two opposite polarity waveforms.

FIG. 1 illustrates an example ideal signal 100 for driving a piezoelectric transducer for harmonic imaging. There is a first waveform, called an upright waveform, indicated by time period 102. At some time later, there is an inverted waveform, indicated by time period 104. The upright waveform has a positive pulse, indicated by time period 106, followed by a negative pulse indicated by time period 108. The inverted waveform has a negative pulse, indicated by time period 110, followed by a positive pulse, indicated by time period 112. Echoes from each transmitted upright waveform and each transmitted inverted waveform are generated when the waveforms encounter a change in density, or when the transmitted waveforms excite a contrast agent. An echo from the upright waveform may be digitized and stored in memory. Likewise, an echo from the inverted waveform may be digitized and stored in memory. The two echo waveforms may be added together, and any differences are assumed to be from distortions generated within the substance being imaged, or from harmonics generated by contrast agents.

For the technique in which echoes from two successive transmitted waveforms are added, it is important that any differences resulting from addition of echoes are generated by asymmetrical propagation within the substance being imaged, or are generated by contrast agents, and not from any differences in the original transmitted waveforms. Ideally, the upright waveform and the inverted waveform are perfectly mirror symmetrical. There is an ongoing need to improve the symmetry of transmitted waveforms for ultrasound harmonic imaging.

DETAILED DESCRIPTION

Figure 2:
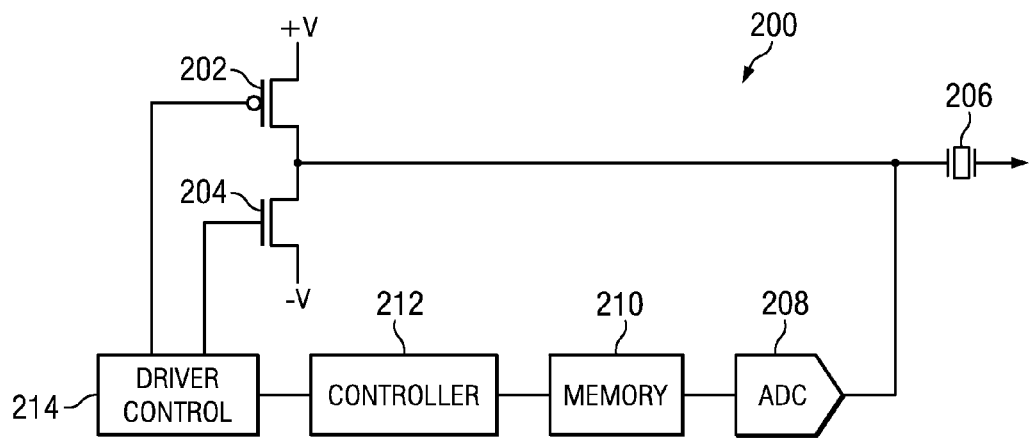
FIG. 2 is a simplified block diagram of an example embodiment of a transmitter circuit.

FIG. 2 illustrates a simplified ultrasound transmitter circuit 200. In FIG. 2, a voltage driver comprising a pull-up transistor 202 and a pull-down transistor 204 generates a voltage driving signal for a piezoelectric transducer 206. The transducer driving signal is digitized by an analog-to-digital converter (ADC) 208. The digitized waveforms are stored in a memory 210 and analyzed by a controller 212. The controller detects asymmetry in the transmitted waveforms and adjusts transducer driver control circuitry 214 to reduce asymmetry. In a typical instrument, there may be an array of hundreds of transducers, each with a separate transducer driver. Different arrays are attached for different imaging purposes.

Typically, the pull-up transistor 202 in FIG. 2 is a PMOS device and the pull-down transistor 204 is an NMOS device. In general, NMOS devices are inherently stronger than PMOS devices, and the two types of transistors inherently have different drain capacitances. Some first-order differences may be compensated for by adjusting the relative sizes of the pull-up and pull-down transistors, and relative nominal drive strengths provided by transducer driver control circuitry 214. However, some inherent differences are not consistent from wafer lot to wafer lot, and they change with aging and temperature. In addition, transducer loads may change from transducer to transducer, and the transducer loads may also change with time and temperature. Accordingly, it is necessary for controller 212 to provide ongoing calibration and adjustment of the driving waveform to the transducer 206 to ensure symmetry in the driving waveforms.

A typical fundamental frequency for a transducer driving waveform is on the order of 2 MHz, and typical peak voltages driving the transducer are on the order of 100 Volts. The high driving frequency, high voltages, and the requirement for precision suitable for detecting small waveform differences mean that the ADC in FIG. 2 has to be relatively high speed, relatively precise, and relatively expensive. The inventors have determined ways to reduce the speed and voltage requirements of the ADC, while still ensuring symmetrical driving waveforms.

Figure 3:
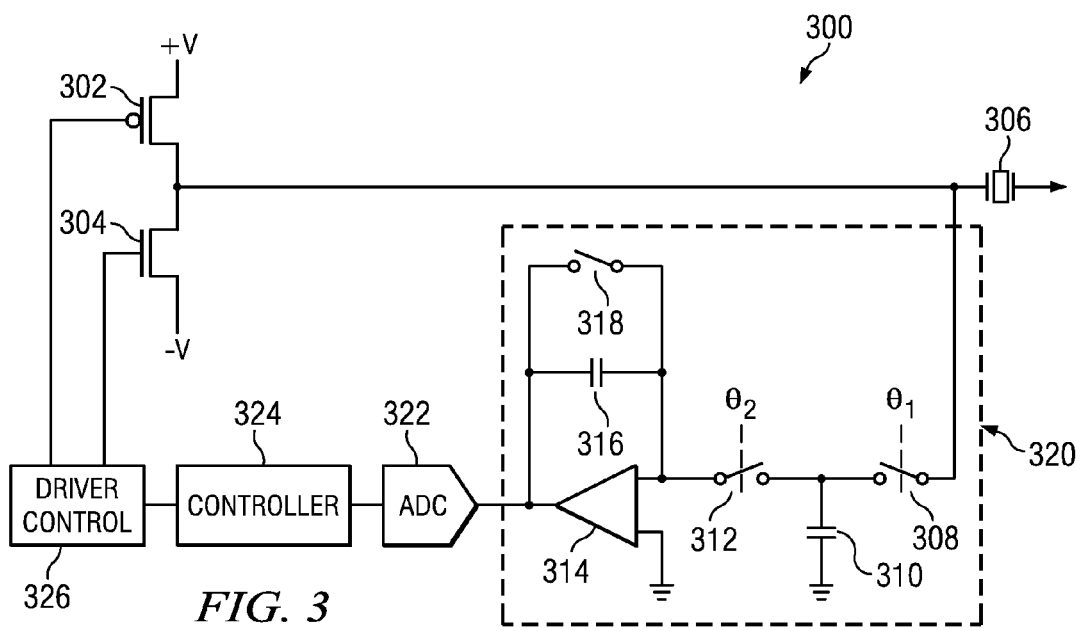
FIG. 3 a simplified block diagram of an alternative example embodiment of a transmitter circuit.

FIG. 3 is an example embodiment of an ultrasonic transmitter circuit with transducer driving waveform calibration (symmetry measurement and driver adjustment). In FIG. 3, a voltage driver comprising a pull-up transistor 302 and pull-down transistor 304 drives a transducer 306. Switches 308 and 312, and capacitor 310, form a switched-capacitor implementation of a resistance. The switched-capacitor resistance along with an operational amplifier 314 and capacitor 316 form an integrator 320. A switch 318 is used to stop the integration time, as discussed in more detail later. The output of the integrator is digitized by an ADC 322. The resulting digital samples from ADC 322 are read by a controller 324, which determines parameters for driver control circuitry 326.

In FIG. 3, switches 308 and 312 along with capacitor 310 also form a sample-and-hold circuit. Non-overlapping clock signals ($\phi_1$, $\phi_2$) control when switches 308 and 312 are open. The time during which switch 308 is closed is the sample interval. At the end of the sample interval, switch 308 is opened and capacitor 310 retains a voltage that is approximately proportional to the average of the upright transducer driving waveform over the sample interval. Shortly after switch 308 is opened, switch 312 is closed and the operational amplifier 314 transfers the charge on capacitor 310 to capacitor 316. This process repeats during a successive inverted transducer driving waveform. At the end of the second cycle, the voltage across capacitor 316 represents the sum of the averages of the two successive transducer driving waveforms (one upright and one inverted) over the two sample intervals. Note that the ADC 322 only has to convert a single voltage at the end of integration, as opposed to the ADC 208 in FIG. 2, which would have to generate many digital samples during the corresponding time periods. Accordingly, the ADC 322 in FIG. 3 can have much lower frequency requirements than the ADC 208 in FIG. 2.

Figure 1:
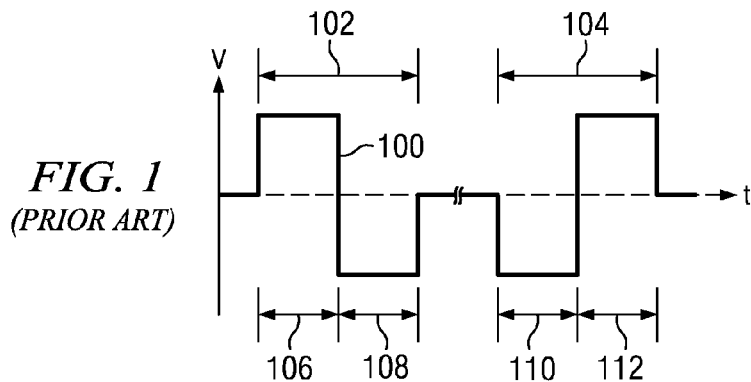
FIG. 1 is a timing diagram of a prior art transmitted waveform.

Note that the integrator could integrate the average transducer driving waveform over one entire upright driving waveform and the successive inverted driving waveform (that is, the sample intervals could be time periods 102 and 104 in FIG. 1). However, the inventors have determined that a zero integral over the entire time period is not an adequate measure of symmetry. That is, waveforms may have a zero overall integral but still have different rise times, different peak voltages, and different pulse periods, resulting in unacceptable asymmetry. By using the switch-capacitor resistance as a sample-and-hold circuit, the integration may occur for two sample intervals that are much shorter than the overall cycle times. This in turn enables asymmetry to be measured over relatively small intervals of the driving waveform. In addition, by measuring asymmetry and adjusting drive parameters in successively longer intervals, asymmetry of earlier portions of the waveforms can be corrected and then longer intervals that include the corrected earlier intervals can be measured.

Figure 4A:
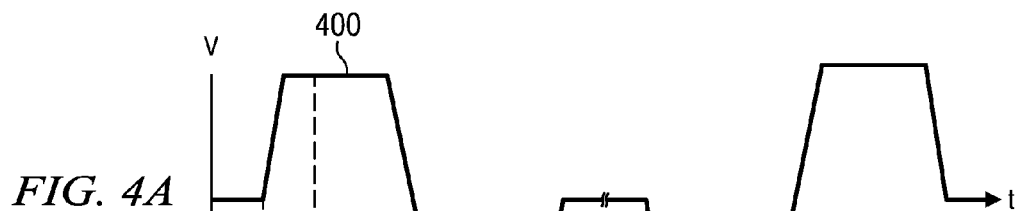
FIGS. 4A-4C are timing diagrams illustrating an example embodiment of timing for the circuit of FIG. 3.
Figure 4B:
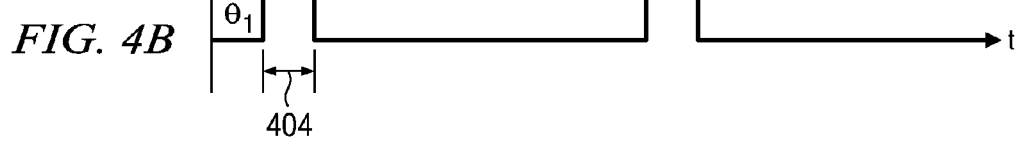
Figure 4C:
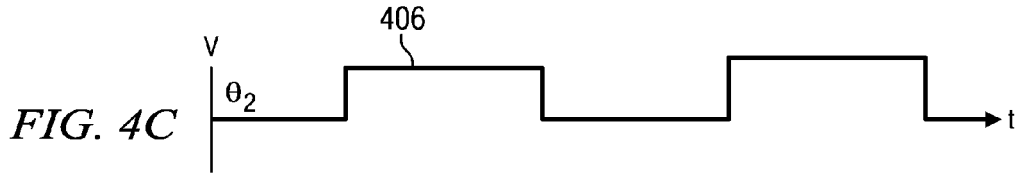

In FIG. 4A, waveform 400 illustrates a transducer driving waveform with finite (non-ideal) rise and fall times, exaggerated to facilitate illustration. In FIG. 4B, waveform 402 illustrates example timing for $\phi_1$, the clock signal driving switch 308 in FIG. 3. In FIG. 4B, time interval 404 is the sample interval. In FIG. 4C, waveform 406 illustrates example timing for $\phi_1$, the clock signal driving switch 312 in FIG. 3. In FIG. 4C, the length of time switch 312 is closed is not critical—it just needs to close long enough to ensure that charge is transferred from capacitor 310 to capacitor 316. In the example of FIGS. 4B and 4C, the driving waveform is sampled only at the initial rise time (slew rate) of the upright waveform and again at the initial fall time (slew rate) of the inverted waveform. As a result, the output of integrator 320 is a measure of the difference of initial rate-of-change of the driving waveforms. Controller 324 may then compensate by changing parameters in driver control circuit 326 that control slew rates.

Figure 5A:
FIGS. 5A-5C are timing diagrams illustrating an additional example embodiment of timing for the circuit of FIG. 3.
Figure 5B:
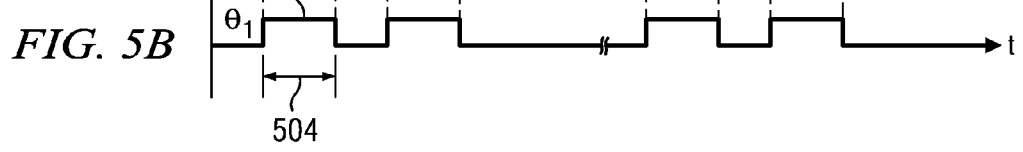
Figure 5C:
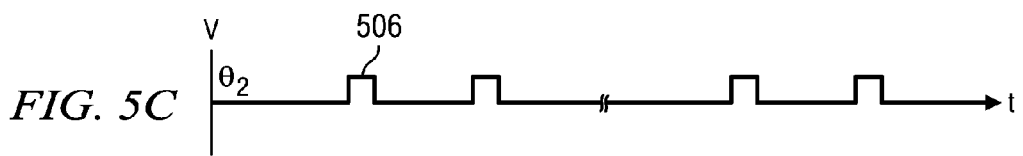

FIGS. 5A-5C illustrate timing for $\phi_1$ and $\phi_2$ for an additional correction for asymmetry. In FIG. 5A, waveform 500 is the same as waveform 400 in FIG. 4A, reproduced for convenience for illustrating timing. In FIG. 5B, waveform 502 illustrates example timing for $\phi_1$, the clock signal driving switch 308 in FIG. 3. In FIG. 5B, time interval 504 is the sample interval. In FIG. 5C, waveform 506 illustrates example timing for $\phi_2$, the clock signal driving switch 312 in FIG. 3. In FIG. 5C, the length of time switch 312 is closed is not critical—it just needs to close long enough to ensure that charge is transferred from capacitor 310 to capacitor 316. For the timing in FIGS. 5B and 5C, the initial zero-to-high transition of the upright waveform (500A) and the initial zero-to-low transition of the inverted waveform (500B) (which are about half the peak-to-peak amplitude) and the full amplitude high-to-low transition of the upright waveform (500C) and the full amplitude low-to-high transition of the inverted waveform (500D) are sampled. If the initial half amplitude transitions (500A and 500B) have already been compensated as a result of sampling as in FIGS. 4B and 4C, then the samples as in FIGS. 5B and 5C add asymmetry checks for the full-amplitude transitions (500C and 500D).

Figure 6A:
FIGS. 6A-6C are timing diagrams illustrating an additional example embodiment of timing for the circuit of FIG. 3.
Figure 6B:
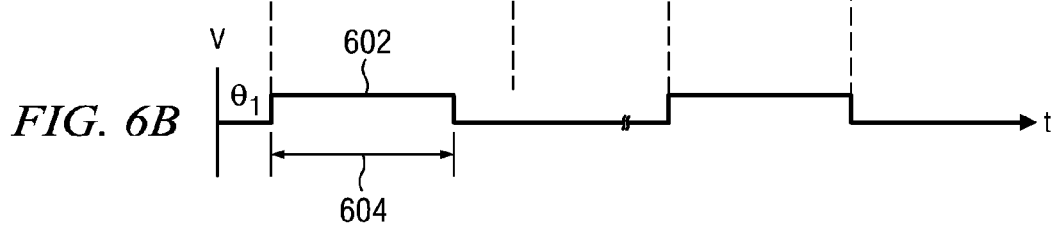
Figure 6C:
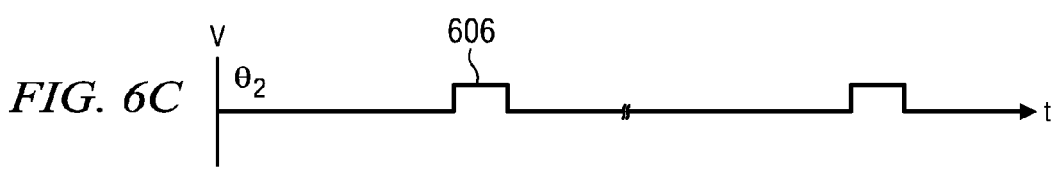

FIGS. 6A-6C illustrate timing for $\phi_1$ and $\phi_2$ for an additional correction for asymmetry. In FIG. 6A, waveform 600 is the same as waveform 400 in FIG. 4A, reproduced for convenience for illustrating timing. In FIG. 6B, waveform 602 illustrates example timing for $\phi_1$, the clock signal driving switch 308 in FIG. 3. In FIG. 6B, time interval 604 is the sample interval. In FIG. 6C, waveform 606 illustrates example timing for $\phi_2$, the clock signal driving switch 312 in FIG. 3. In FIG. 6C, the length of time switch 312 is closed is not critical—it just needs to close long enough to ensure that charge is transferred from capacitor 310 to capacitor 316. In the example of FIGS. 6B and 6C, the sample interval starts at the same time as in FIG. 4B, but the sample interval is extended to sample the rise time, peak, and the entire fall time of the first pulse of the upright waveform and again at the fall time, peak and during the entire rise time of the first pulse of the inverted waveform. As a result, the output of integrator 320 is then a measure of the difference of the areas of the first pulses. If the slew rates have been measured (and compensated) as in FIGS. 4B, 4C, 5B and 5C, then effectively the timing of FIGS. 6B and 6C measures the difference in pulse widths. Controller 324 may then compensate by changing parameters in driver control circuit 326 that control pulse widths.

FIGS. 4B, 5B, and 6B only illustrate three of many possibilities. By adjusting drive parameters in successive steps as the sample intervals increase, mirror symmetry can be assured for all portions of driving waveforms. In particular, once mirror symmetry is ensured for some early portion of the waveforms, the contribution of the early portion of the waveforms will be null regardless of how much more of the waveform is sampled by lengthening the sample interval. In addition, the sample interval does not need to start at the beginning of a pulse. Any portion of a waveform may be sampled. However, by starting the sample interval at the beginning of a pulse, or slightly earlier, the timing of $\phi_1$ becomes non-critical.

The integrator 320 in FIG. 3 can add contributions over any number of successive sensing cycles. It can be used within a proportional loop in which the feedback (the amount of correction applied to the driver devices) is proportional to the error. Each time the integrator starts a new integration period, switch 318 is closed to discharge capacitor 316.

Figure 7:
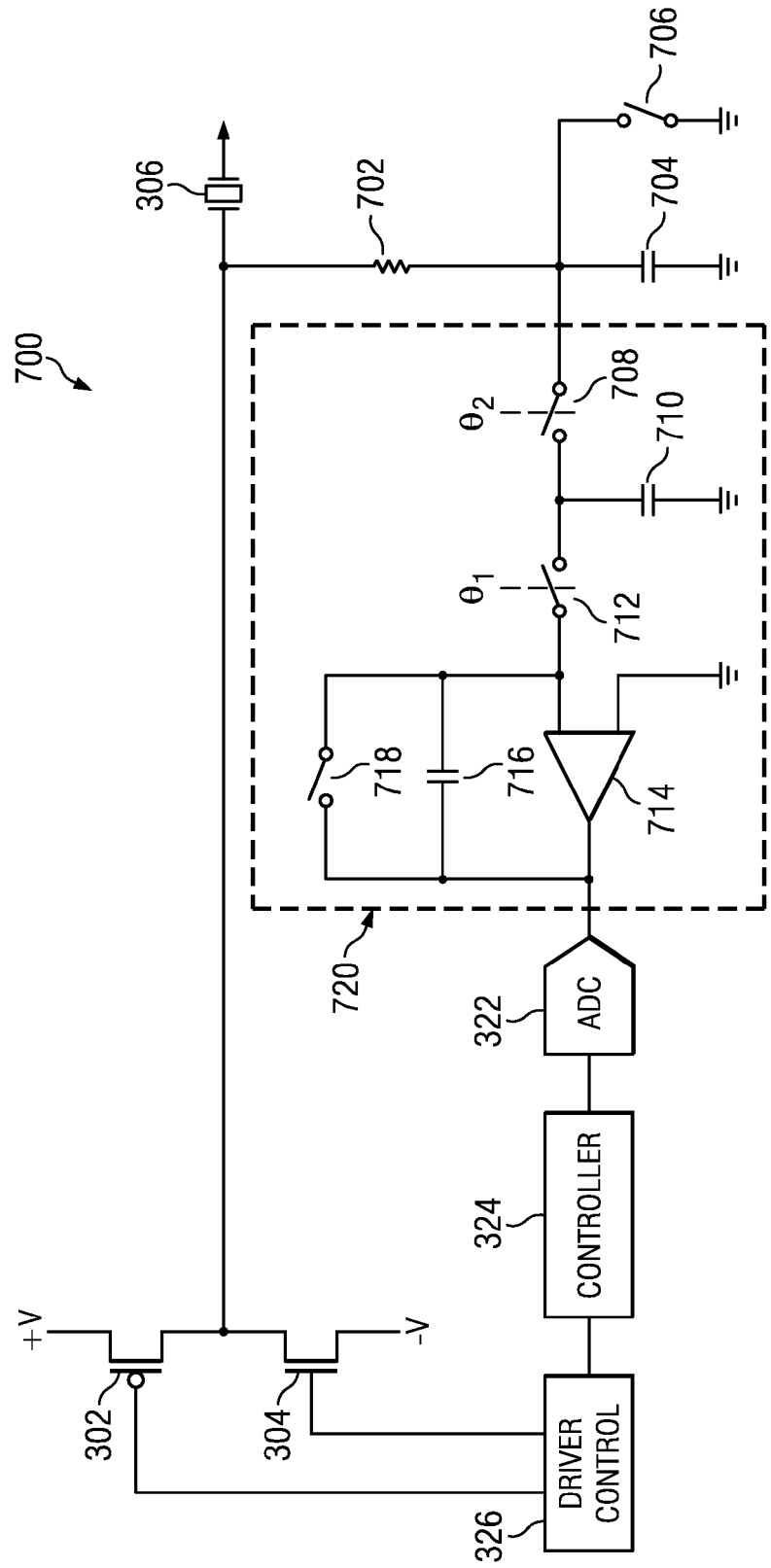
FIG. 7 is a simplified block diagram of an example variation of the example embodiment of FIG. 3.

The example embodiment of FIG. 3 reduces the frequency requirements for ADC 322, but still imposes high voltages on the sample-and-hold circuit, integrator, and analog-to-digital converter. FIG. 7 illustrates an alternative example embodiment of an ultrasound transmitter circuit 700. Elements in FIGS. 3 and 7 having identical numbers may be identical elements. Switches 708 and 712, and capacitor 710, form a switched-capacitor implementation of a resistance. The switched-capacitor resistance along with an operational amplifier 714 and capacitor 716 form an integrator 720. A switch 718 is used to stop the integration time. In FIG. 7, an R-C low-pass filter (resistor 702, capacitor 704) has been added between the input of the transducer 306 and switch 708. Also in FIG. 7, switch 706 can discharge capacitor 702. The time constant of the R-C filter may be long, so that the filter approximates an integrator. This integration property serves three purposes. First, it reduces the magnitude of the signal that needs to be processed, reducing the voltage requirements for all the elements within integrator 720, and the ADC 322. Second, it reduces the bandwidth of the signal to be processed by the rest of the sensing circuit. Third, at the end of a driving pulse period, the integration process generates a signal that is proportional to the average of the pulse. For example, the low-pass filter may be used to integrate over the sampling interval 602 in FIG. 6B. The low-pass filter performs this integration passively and accurately.

Figure 8:
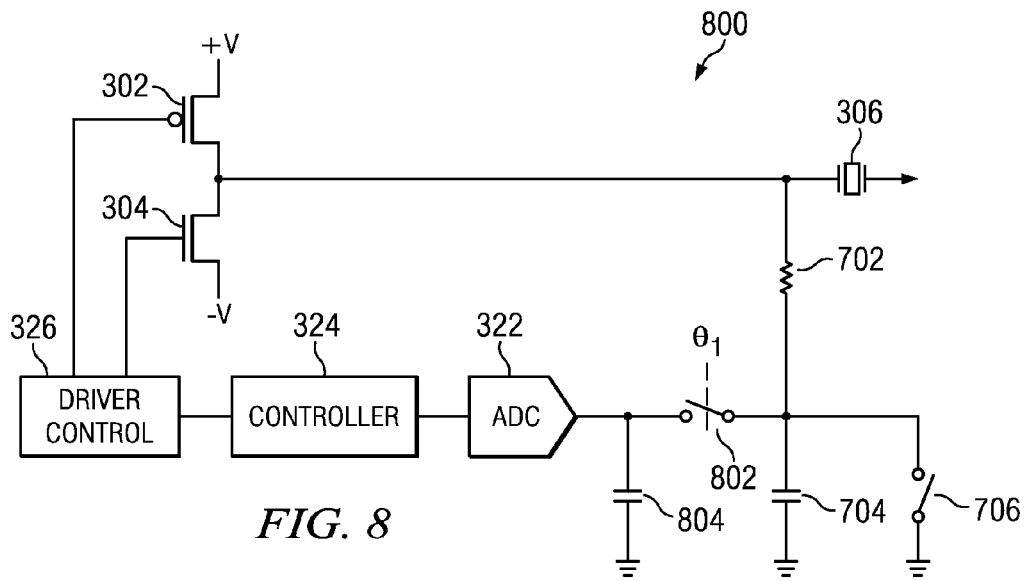
FIG. 8 is a simplified block diagram of an example variation of the example embodiment of FIG. 7.

FIG. 8 illustrates an alternative example embodiment for an ultrasound transmitter circuit 800. Elements in FIGS. 3, 6 and 7 having identical numbers may be identical elements. In FIG. 8, the integrator has been eliminated, and the integration role is assumed by the low-pass filter and the controller 324. A switch 802 and capacitor 804 serve as a sample-and-hold, with the timing for switch 802 controlled by $\phi1$ as in FIGS. 4B, 5B, and 6B.

As another alternative example embodiment of the circuits of FIGS. 3, 7 and 8, the ADC 322 may be replaced by a comparator, which is essentially a one-bit ADC. When operating as a feedback loop, the input to the comparator will stay near the comparator threshold only when mirror symmetry has been achieved.

Each of the embodiments of FIGS. 3, 7, and 8 reduces the speed requirements of the ADC 322 relative to the ADC 208 in the embodiment of FIG. 2, and the embodiments of FIGS. 7 and 8 reduce the speed and voltage requirements of the ADC 322 relative to the ADC 208 in the embodiment of FIG. 2. The ADC 322 in FIG. 3 can operate slower than the ADC 208 in FIG. 2 because it is digitizing voltages that are integrated over the sample interval instead of real-time samples of the driving waveform. Comparing the ADC 322 in FIGS. 7 and 8 to the ADC 208 in FIG. 2, the ADC 322 in FIGS. 7 and 8 can operate at a lower voltage, and benefits from reduced bandwidth, smaller signal size, and the averaging properties of the low-pass filter.

Figure 9:
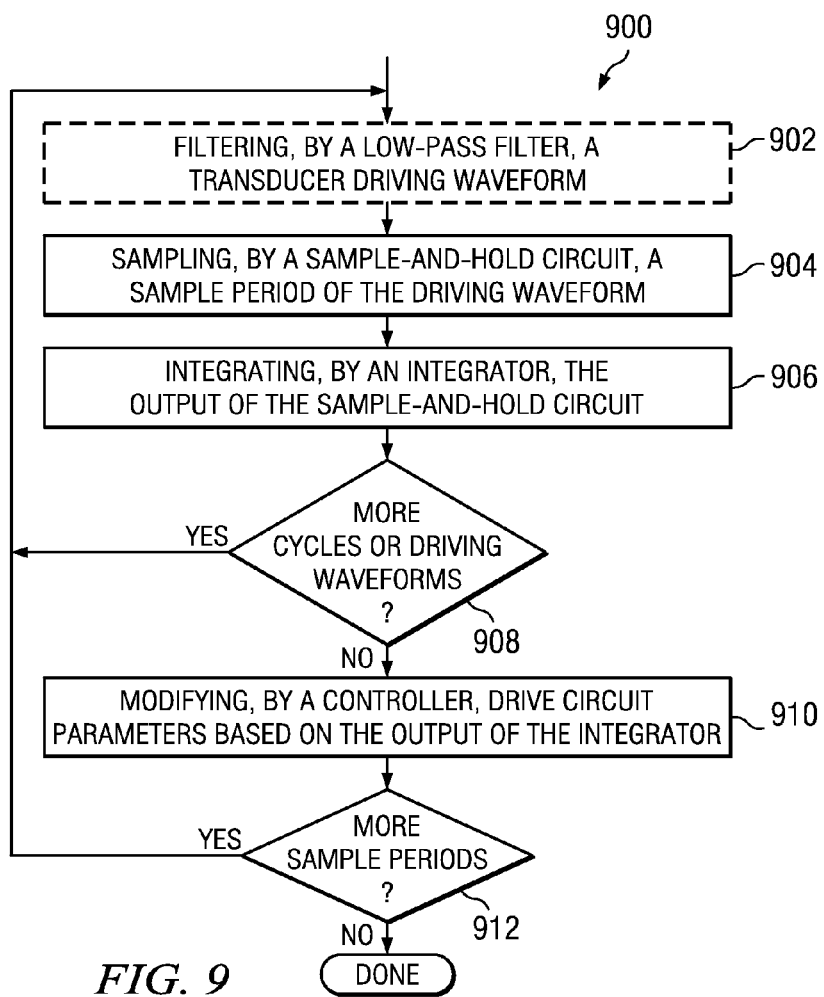
FIG. 9 is a flow chart of an example embodiment of a process for measuring asymmetry of a transmitted waveform.

FIG. 9 is a flow chart illustrating an example process 900 for detecting asymmetry in transducer driving waveforms in ultrasound transmitters. Note that the arrangement of steps in the flow chart is for purposes of illustration of an example only, and the arrangement does not necessarily imply a specific required order. In particular, some steps may occur simultaneously. In addition, some steps illustrated in the flow chart may be optional. In particular, identification of a step as optional does not necessarily imply that steps not identified as optional are mandatory. At optional step 902, a transducer driving waveform is filtered by a low-pass filter. At step 904, the driving waveform is sampled for a sample period by a sample-and-hold circuit. At step 906, the output of the sample-and-hold circuit is integrated by an integrator. At step 908, if integration is needed over more cycles of the driving waveform then the steps of sampling and integrating are repeated. At step 910, the output of the integrator is used by a controller to modify drive parameters. At step 912, if the process needs to repeat for additional sample periods, then the steps of sampling, integrating, and modifying are repeated.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method, comprising the steps of:
   sampling, by a sample-and-hold circuit, a sample period of a driving waveform having an upright waveform and an inverted waveform;
   receiving, by a switched capacitor network, the output of the sample-and-hold circuit
   integrating, by an integrator, the output of the switched capacitor; and
   modifying, by a controller, drive circuit parameters of the driving waveform having an upright waveform and an inverted waveform; based on the output of the integrator.

2. The method of claim 1, the step of sampling further comprising:
   sampling a portion of an upright driving waveform and sampling a corresponding portion of an inverted driving waveform.

3. The method of claim 1, further comprising, before the step of sampling:
   filtering, by a low-pass filter, the driving waveform.

4. The method of claim 1, further comprising:
   repeating the steps of sampling and integrating over multiple cycles of the driving waveform.

5. The method of claim 1, further comprising:
   repeating the steps of sampling, integrating, and modifying, over multiple sample periods.

6. An apparatus, comprising
   means for sampling, by a sample-and-hold circuit, a sample period of a driving waveform having an upright waveform and an inverted waveform;
   means for receiving, by a switched capacitor, the output of the sample-and-hold circuit
   means for integrating, by an integrator, the output of the switched capacitor network; and means for modifying, by a controller, drive circuit parameters of the driving waveform having an upright waveform and an inverted waveform; based on the output of the integrator.

7. The apparatus of claim 6, the step of sampling further comprising:
means sampling a portion of an upright driving waveform and sampling a corresponding portion of an inverted driving waveform.

8. The apparatus of claim 6, further comprising, means for filtering, by a low-pass filter, the driving waveform.

* * * * *